(12) United States Patent
Schein

(10) Patent No.: US 6,326,799 B1
(45) Date of Patent: Dec. 4, 2001

(54) WIRELESS TEST FIXTURE FOR TESTING PRINTED CIRCUIT BOARDS

(76) Inventor: Charles A. Schein, c/o Schein Research, Inc., 4306 Regency Dr., Glenview, IL (US) 60025

(*) Notice: Subject to any disclaimer, the term of this patent is extended or adjusted under 35 U.S.C. 154(b) by 0 days.

(21) Appl. No.: 09/515,454

(22) Filed: Feb. 29, 2000

(51) Int. Cl.⁷ .................................................... G01R 31/02
(52) U.S. Cl. ............................................................ 324/754
(58) Field of Search .................................... 324/754, 758, 324/761; 439/482

(56) References Cited

U.S. PATENT DOCUMENTS

| | | | |
|---|---|---|---|
| 5,420,519 | * | 5/1995 | Stowers et al. ........................ 324/754 |
| 6,104,205 | * | 8/2000 | Mawbry ................................. 324/761 |
| 6,208,158 | * | 3/2001 | Schein et al. ......................... 324/761 |

* cited by examiner

Primary Examiner—Safet Metjahic
Assistant Examiner—E P LeRoux

(74) Attorney, Agent, or Firm—Jonathan Feuchtwang; Piper Marbury Rudnick & Wolfe

(57) ABSTRACT

A wireless assembly for communicating electrical signals between test equipment and a unit under test using contact probes having at a first end a spring-loaded head electrically connected to a test point on the unit under test, and having at a second end a fixed contact post. The wireless assembly is provided with a translator board having at least one conductive pad electrically connected to the test equipment. A guide plate having a first through hole communicating with a bore is provided on the translator board. A contact receptacle is provided in the bore and electrically contacts the conductive pad. The contact receptacle is adapted to at least partially receive the contact post, and is provided with at least one contact finger configured to swipe the contact post and maintain electrical connection therebetween. A spring provided in the bore urges the contact receptacle into electrical contact with the at least one conductive pad. The contact receptacle is configured to allow travel of the contact post while maintaining electrical connection therebetween and without transmitting a transient force to the translator board.

11 Claims, 7 Drawing Sheets

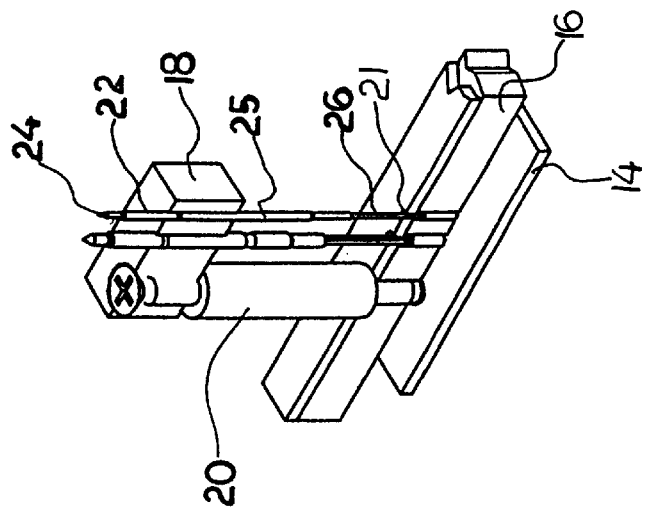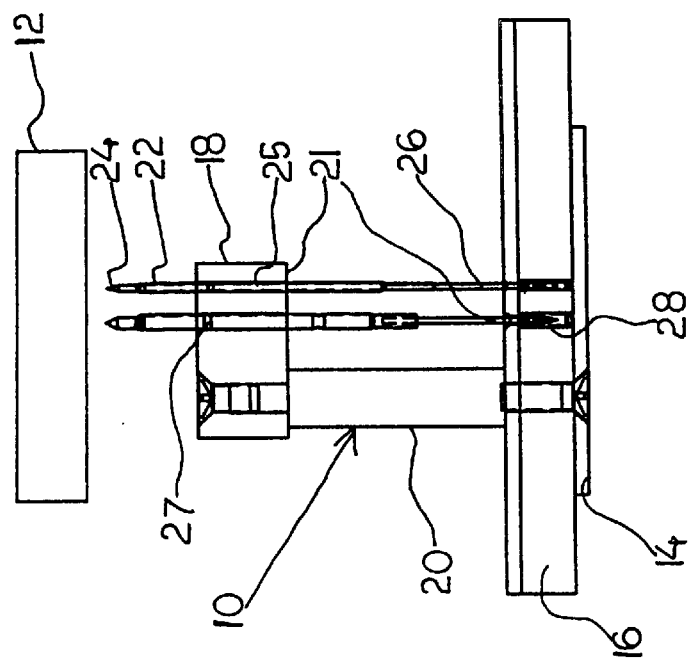

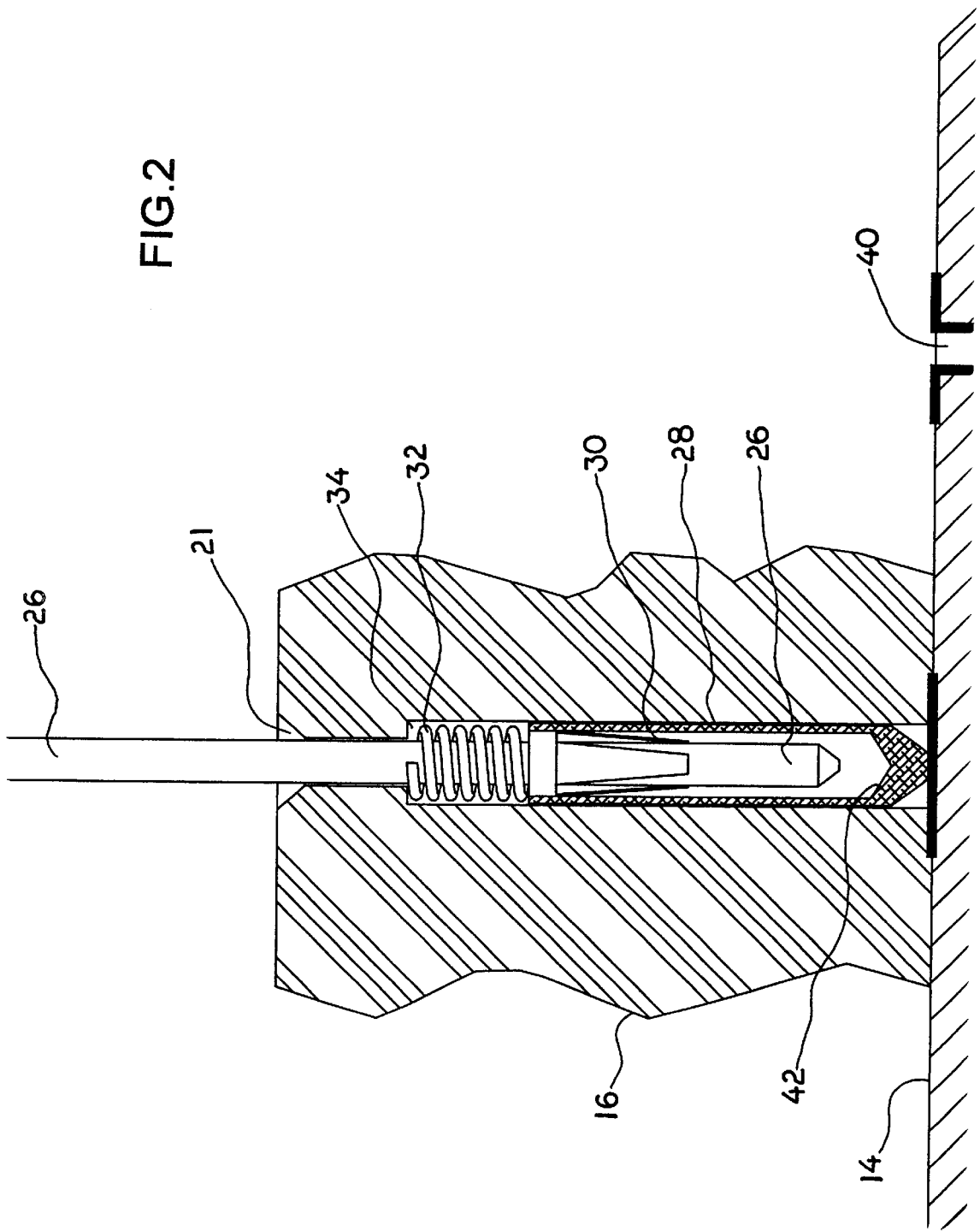

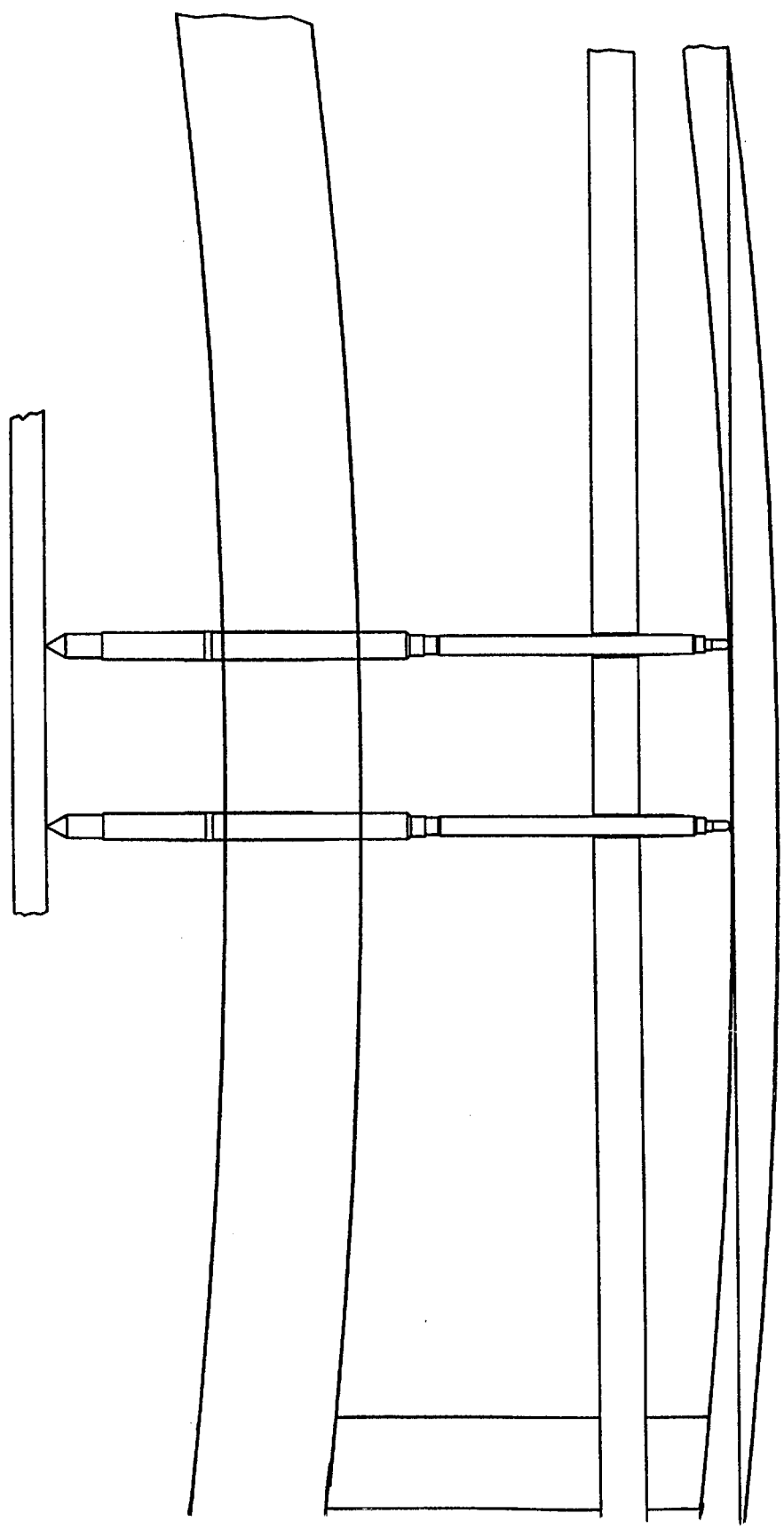

WIRELESS TEST FIXTURE FOR TESTING PRINTED CIRCUIT BOARDS

FIELD OF THE INVENTION

The present invention relates to a wireless assembly used for in-circuit testing of printed circuit boards. More particularly, the present invention relates to a test fixture for in-circuit testing of printed circuit boards using relatively inexpensive single headed probes. The improved design of the text fixture of the present invention provides reliable electrical contact between diagnostic or testing equipment and a unit under test, while minimizing the effects of transient forces which typically reduce the life of the test fixture.

BACKGROUND OF THE INVENTION

There is an ongoing trend in the electronics industry to reduce or miniaturize the size of electronic components, to increase the density of components on a given printed circuit board by reducing the pitch or spacing between components, and to increase the speed or frequency at which the components operate. On large, and/or fast, and/or high-density boards the test industry has adopted the use of a printed circuit board (translator board) to connect the probes of a test fixture to the tester interface. The use of a translator board provides numerous electrical advantages over using discrete wires installed by hand wiring (wire wrapping).

In conventional wireless test assemblies, a double headed probe is used to electrically connect the translator board with the unit under test. The double headed probe is generally comprised of two parts, a probe and a probe socket. The probe is configured to be at least partially received within the probe socket, and the assembly has a spring-loaded head at each end. In operation, one spring-loaded head is electrically engaged with a test point on the unit under test (UUT) and the other spring-loaded head is electrically engaged with a test point on the translator board.

While the use of double headed probes in combination with translator boards presents certain advantages over the use of wire wrapping, there are also numerous disadvantages. One such disadvantage relates to the cost of double ended socket probes. Double headed probes are significantly more expensive than single-headed probes. The cost differential between single headed probes and double headed probes becomes significant as the number of probes increases. Notably, the number of probes required to test a complex circuit may easily number in the thousands or even tens of thousands. Thus, a significant cost savings could be realized by using single headed probes in place of double headed probes.

Another disadvantage relates to the cost of manufacturing the translator board. Printed circuit boards such as the translator board are expensive when manufactured in small quantities. There is a substantial non-reoccurring engineering (NRE) cost for designing a translator board. This NRE cost is only economical when amortized over a large number of circuits tested using the translator board.

As the complexity of the circuit being tested increases, the number of test points increases and the size of the translator board used to provide electrical connection between test machine and the test points increases. There is an inverse relationship between the size of the printed board and the number of vendors capable of manufacturing the board. Thus, as the physical size of the translator board increases, the number of companies capable of manufacturing these boards decreases. As a result, board manufacturers charge a premium for large printed circuit boards.

The high manufacturing cost and the NRE cost makes it highly desirable to maximize the life of a translator board, which is measured in terms of test cycles. However, the life of the translator board is often diminished as a result of transient forces. The transient forces are physical forces which occur cyclically (transiently) each time a unit is tested.

Conventional wireless test assemblies impart a cyclical or transient force to the translator board each time a unit is tested. Over time this transient force causes wearing of contact pads and warping of the translator board, thereby reducing the life of the translator board.

Accordingly, a need exists for a test assembly which facilitates reliable electrical contact between a testing assembly and UUT, does not require fixed wiring, and minimizes the occurrence of transient forces on the translator board.

A need further exists for a test assembly which provides enhanced flexibility without requiring the use of double-ended probes.

SUMMARY OF THE INVENTION

Briefly, the present invention relates to a wireless assembly for communicating electrical signals between test equipment and a unit under test using one or more single headed probes. Each single headed probe is composed of a spring loaded head removably inserted into a probe socket having an electrical contact (socket contact). The head is electrically connected to the unit under test, and the socket contact is operably connected to a selected contact point on the translator board and provides reliable, wireless electrical connection therebetween.

The socket contact is a fixed contact which is at least partially received within a contact receptacle provided within an enlarged bore in the guide plate. A spring also provided in the bore pushes the receptacle into electrical contact with the translator board. The contact receptacle has several flexible contact fingers which swipe the fixed contact as the contact is inserted into the contact receptacle and exert a pressing force on a circumference of the fixed contact.

These and other aspects of the invention will be more fully understood by referring to the following detailed description and the accompanying drawings.

BRIEF DESCRIPTION OF THE DRAWINGS

FIG. 1A is a front sectional view of a wireless test fixture according to the present invention;

FIG. 1B is a perspective view of the wireless test fixture of FIG. 1A;

FIG. 2 is a partial sectional view of the wireless test fixture of FIG. 1A;

FIGS. 6A and 6B are perspective views of a conventional test fixture.

DETAILED DESCRIPTION OF THE INVENTION

Figure 3A:
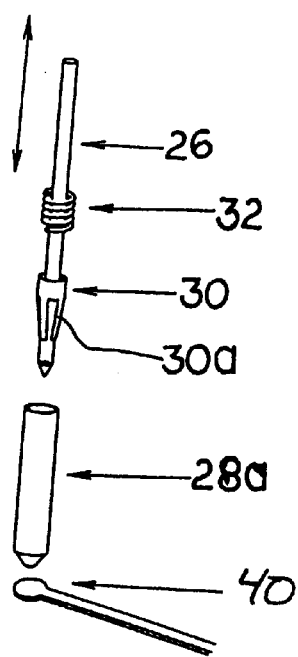
FIG. 3A is an enlarged exploded view of a contact receptacle of according to the present invention.

FIGS. 1A and 1B shows a first embodiment of the wireless test assembly of the present invention generally designated 10. The wireless assembly 10 communicates electrical signals between test equipment (not shown) and a unit under test (UUT) 12. Importantly, electrical connection between the wireless assembly 10 and the UUT 12 is achieved using single headed probes which are significantly less expensive than double headed probes used in conventional wireless test assemblies.

The wireless test assembly 10 includes a translator board 14, a guide plate 16, and a probe plate 18. The probe plate 18 is supported in a spaced relationship with the guide plate 16 by plural standoffs 20 (only one standoff shown). The generally planar surface of the guide plate 16 is supported on the generally planar surface of the translator board 14.

Each of the probe plate 18 and the guide plate 16 are provided with through holes 21 configured to receive a single-headed probe 22. The single-headed probe 22 is generally composed of a spring loaded head 24 which is removably inserted in a probe socket 25. The probe socket 25 is equipped with a fixed contact post 26, and a compression ring 27 is formed on a peripheral surface of the probe socket. In operation, the spring loaded head 24 is pressed into contact with a test point on the UUT 12, and the contact post 26 is at least partially received within a contact receptacle 28.

The compression ring 27 is configured to be slightly larger than the diameter of through hole 21, and thus generally prevents downward travel of single-headed probe 22 when a force is applied to the spring-loaded head 24 in the direction of the translator board 14.

Figure 3B:
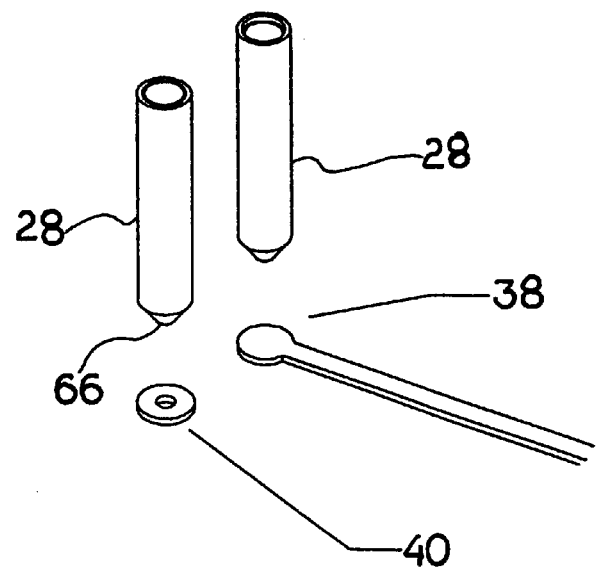
FIG. 3B is an enlarged view of the contact receptacle of FIG. 3A.

As best seen in FIGS. 2 and 3, the contact receptacle 28 has a generally hollow elongate body 28a formed of an electrically conductive material. The contact receptacle 28 is provided with a contact 30 including at least one flexible, electrically conductive finger 30a configured to swipe the contact post 26 as the post is inserted into the contact receptacle 28, thereby firmly establishing electrical connection therebetween.

As best seen in FIG. 2, the contact receptacle 28 and a spring 32 are provided in a bore 34 which communicates with the narrower through hole 21 defined in the guide plate 16. The diameter of the through hole 21 is sized large enough to pass the contact post 26, while still being small enough to prevent passage of the spring 32 or the contact receptacle 28. The spring 32 exerts a pushing force on the contact receptacle 28 toward the translator board 14, thereby maintaining electrical contact between the contact receptacle 28 and a conductive pad 38 or via 40 (FIG. 3) on the translator board 14.

The contact receptacle 28 is configured to ensure that the contact post 26 may travel in a longitudinal direction toward the translator board while maintaining good electrical contact with the contact fingers 30 and without contacting an inner bottom portion 42 of the contact receptacle 28. See, FIG. 2. This aspect of the invention avoids the transmission of transient forces to the translator board. According to a preferred embodiment, the contact receptacle is configured to allow the contact post 26 to travel between 0.090 and 0.190 inches without contacting the inner bottom portion 42 (measured from the bottom of the flexible contact finger contact 30 to the inner bottom portion 42). As will be discussed below, this range not only avoids the transmission of transient forces to the translator board, but also allows for variation in insertion depth of the contact post among probes.

Figure 6A:
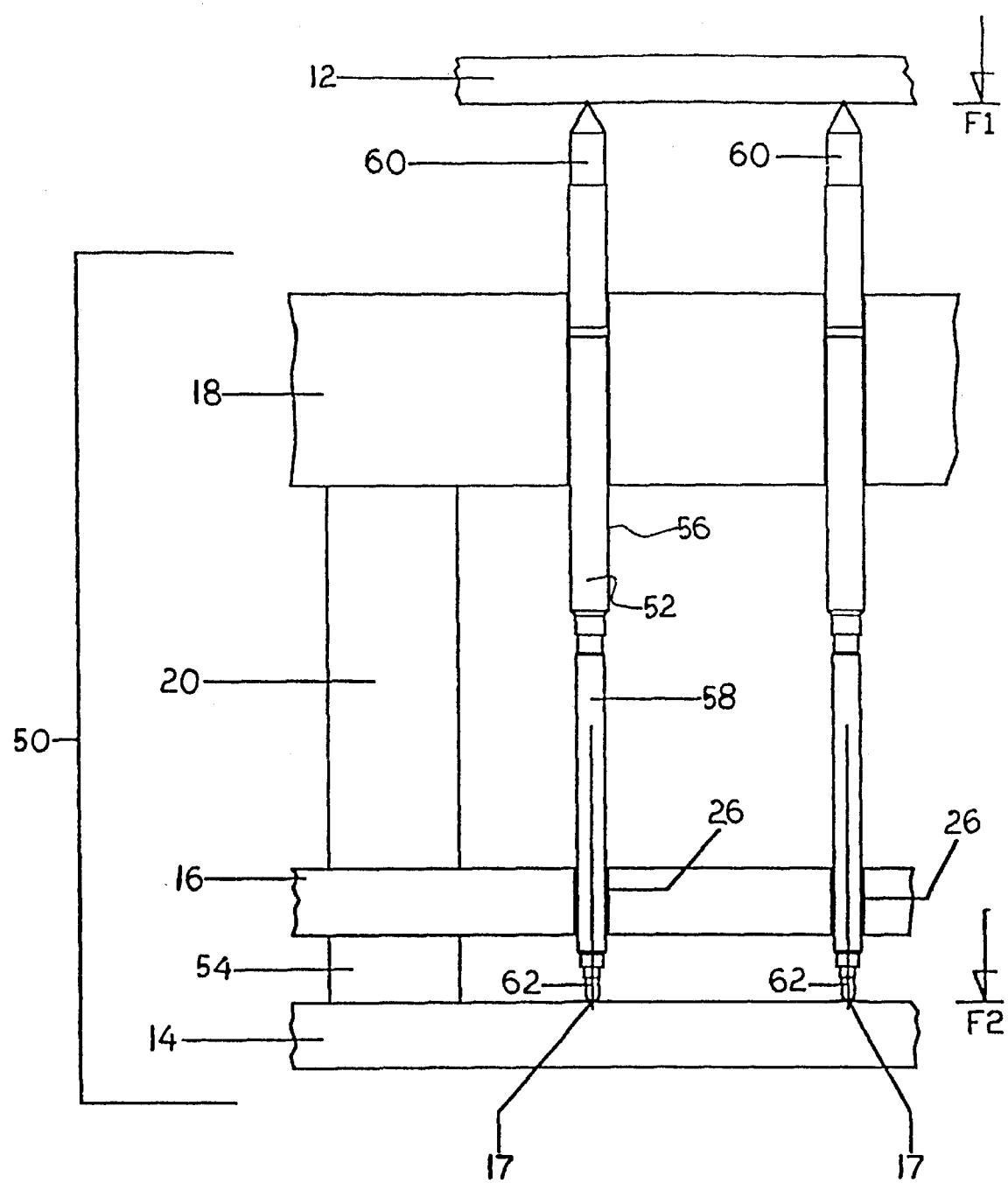

The problem of transient forces will be understood from the following discussion of a conventional wireless assembly 50 which is shown in FIGS. 6A and 6B.

The wireless test assembly 50 differs from the wireless test assembly 10 (FIG. 1) in several key aspects. Notably, the wireless test assembly 50 uses two-headed probes 52, which are significantly more expensive than the single headed probes 22. Additionally, the wireless test assembly 50 does not utilize the contact receptacle 28 or the spring 32. Still further, the guide plate 16 is supported in a spaced relationship from the translator board 14 by plural spacers 54 (only one spacer shown).

The double-ended probe 52 is generally composed of two portions, a probe 56 and a probe socket 58, each of which is provided with a spring-loaded head or contact 60, 62. The probe socket 58 is a generally elongated hollow body adapted to receive the probe 56. The probe socket 58 is inserted through corresponding through holes defined in the probe plate 18 and guide plate 16.

The double-ended probe 52 is a conventional spring loaded electrical contact probe such as disclosed in U.S. Pat. No. 4,814,698 to Johnston et al. In operation, the UUT 12 is placed on the probe heads such that each contact 60 is positioned in contact with a test point on the UUT 12. Subsequently, a force F1 along a longitudinal direction of the probe 52 (shown by a corresponding arrow F1) presses the UUT 12 into contact with the spring loaded contact 30 of the probe 26 thereby ensuring firm electrical connection therebetween.

Electrical connection between the contact 62 and the translator board 14 is maintained by pressing the contact 62 against the translator board 14 with a force F2 sufficient to slightly compress the spring loaded contact 32. Ideally, forces F1 and F2 are independent of each other. Notably, a compression ring 64 provided on a circumference of the probe socket 58 inhibits downward movement of the probe socket 58 when the force F1 is applied to the contact 60. Moreover, the standoffs 54 are intended to isolate the force F1 from the translator board 14.

Turning now to FIG. 6B, in operation, the probe plate 18 tends to bow downwards toward the translator board 14 each time the force F1 is applied. In turn, the bowing of the probe plate 18 pushes the contact 62 of the probe socket 58 into the translator board 14. Thus, in reality, the translator board experiences a transient force each time the force F1 is exerted on the contact 60. Over time this transient force tends to damage the translator board 14. Moreover, this problem is exacerbated as the number of spring-loaded contacts increases.

Still further, the translator board 14 it self tends to be warped by the transient forces in combination with the static pressure exerted by the pressure of the contact 62 on translator board 14.

To ameliorate this problem, conventional wireless assemblies may resort to thicker, more robust translator boards. However, thicker translator boards are significantly more expensive. Moreover, the use of thicker boards is undesirable due to difficulties in ensuring flow-through soldering.

The present invention greatly reduces the effects of transient forces, and thus eliminates the need for a thicker translator board. According to a preferred embodiment, the thickness of translator board is within the range of 0.062–0.125 inches.

Figure 4:
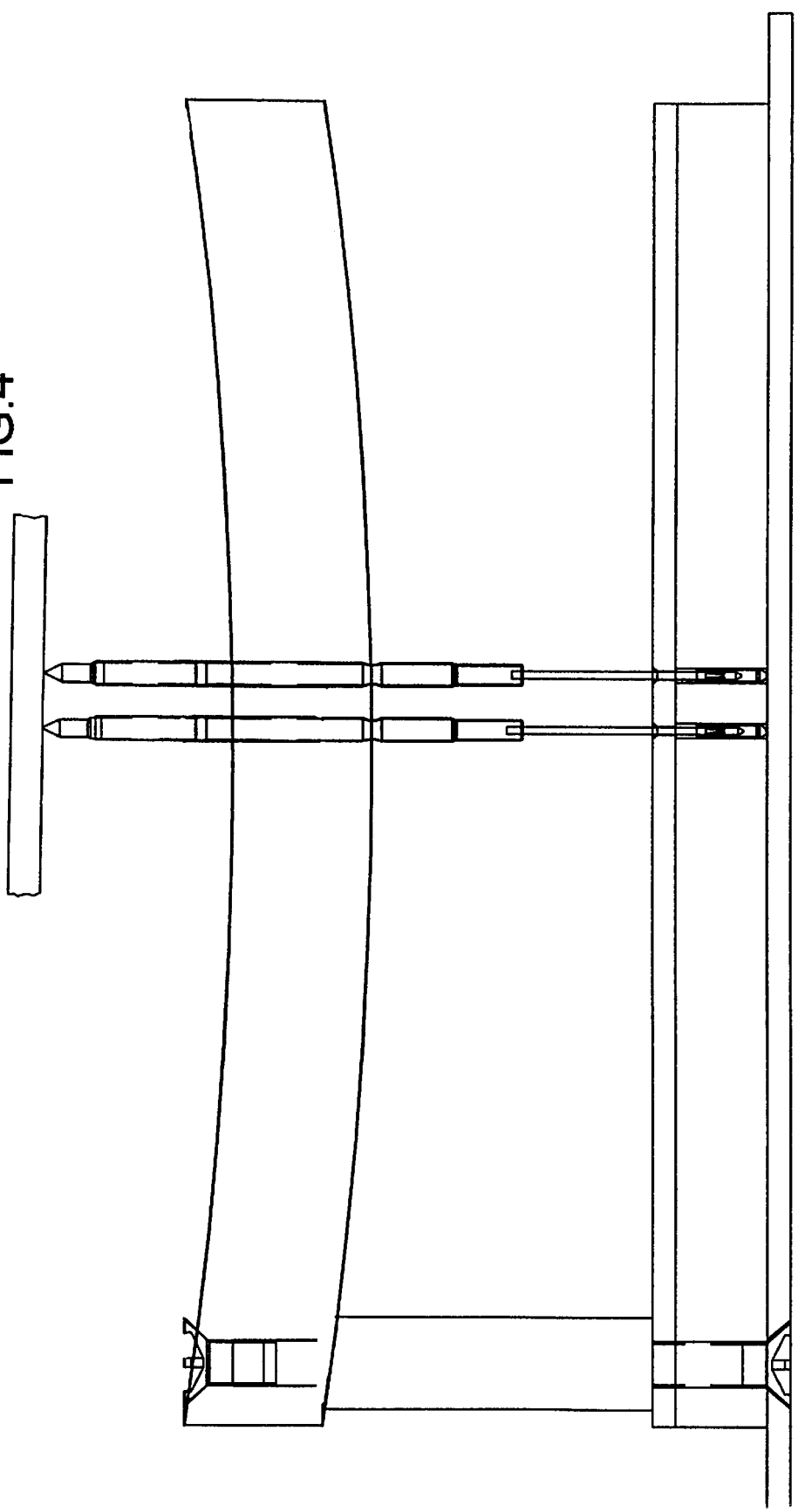
FIG. 4 shows bowing of a probe plate in the wireless test fixture of the FIG. 1A.

Referring to FIG. 4, the transmission of transient forces to the translator board 14 are avoided in the wireless test assembly 10 of the present invention, even if the probe plate 18 bows. As shown in FIG. 4, the contact receptacle 28 is configured such that the contact post 26 may travel within the contact receptacle 28 towards the translator board 14 in the event of bowing of the probe plate 18, without imparting any additional force on the translator board. In effect, the contact receptacle absorbs the movement of the contact post 26 caused by bowing of the probe plate 18.

Additionally, in the wireless assembly 10 of the present invention, the guide plate 16 is mounted to the translator board 14 such that the surface of the guide plate supports and increases the rigidity of the translator board 14. Notably, the wireless assembly 10 omits the use of spacers 54 used in conventional devices (FIG. 6A).

Conventional wireless assemblies, such as the one shown in FIG. 6A, utilize spacers 54 to provide clearance between the guide plate 16 and the translator board 14. This clearance is needed, for among other things, to enable the surface mounting of electrical components 68 on the translator board 14.

Figure 5:
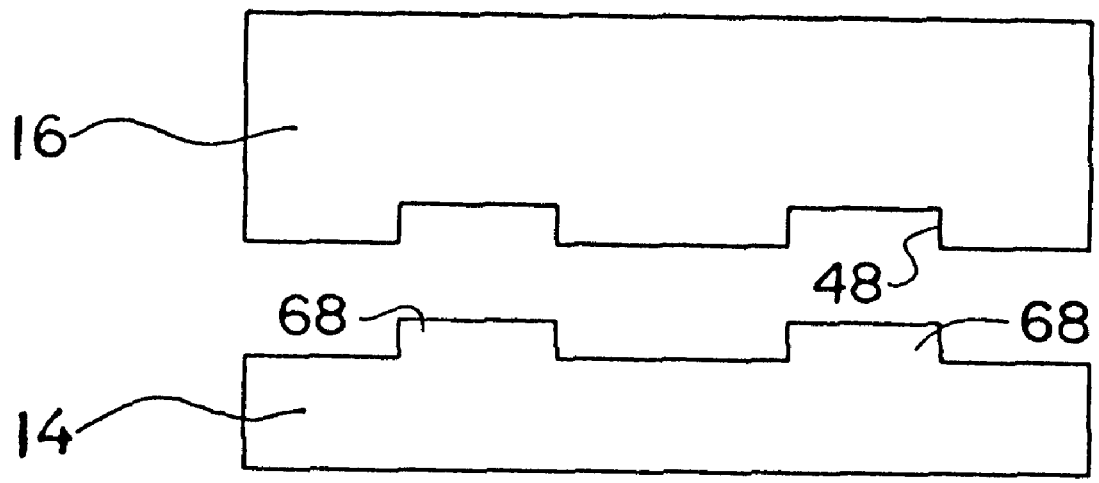
FIG. 5 is a sectional view of a guide plate according to the present invention.

As noted above, the wireless test assembly of the present invention omits the use of spacers. Thus, in the event that it is necessary to mount electrical components 68 on a surface 44 of the translator board 14, a surface 46 of the guide plate 16 is routed to provide the necessary clearance. By manner of illustration, FIG. 5 shows an enlarged sectional view of a guide plate 16 including an optional routed portion 48 defined in the surface of the guide plate 16. In this manner, provision is made for the mounting of electrical components 68 on the surface 40 of the translator board 14, while generally maintaining the surface contact between the translator board 14 and the guide plate 16.

Figure 7:
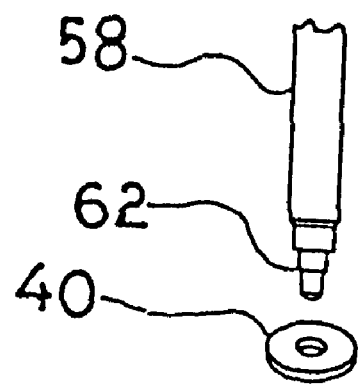
FIG. 7 shows a conventional test assembly.

Another problem associated with the conventional wireless test assembly 50 relates to the sizing of vias 40. As is known to one of ordinary skill in the art, vias 40 are used to provide electrical interconnection between different layers of the translator board 14. A difficulty arises in conventional assemblies in providing electrical connection between a miniature double-ended probes 52 and vias 40 on the translator board 14. This problem occurs because the diameter of the contact 60, 62 may be smaller than the required diameter of the via 40. See, FIG. 7. The via diameter constraint is necessitated by various manufacturing concerns.

As described above, a thicker, more robust translator board is used in conventional assemblies to reduce the effects of transient forces on the translator board. However, it is difficult to reliably plate through a small diameter via in a relatively thick translator board. The thicker the board, the larger the required diameter of the via 40.

The contact receptacle 28 of the present invention eliminates the aforementioned difficulty in providing electrical connection between a miniature probe 22 and the via 40. As best seen in FIG. 3, a contact surface 66 of the contact receptacle 28 which contacts the translator board 14 is independent of the size or diameter of the contact post 26. Moreover, when comparing like size double-headed and single headed probes, the surface area of contact surface 66 is appreciably larger than the diameter of the contact 60, 62. Consequently, the contact receptacle 28 may be directly connected to the via 40, without unduly constraining the size of the via plated-though hole diameter.

One of ordinary skill in the art will appreciate that the contact receptacle 28 of the present invention is electrically connected to the pads 38 or vias 40 on the translator board 14 without the need for solder or solder paste.

Additionally, one of ordinary skill in the art will appreciate that the construction and height of the contact receptacle 28 enables the wireless test fixture of the present invention to compensate for variances in the insertion depth between each contact post 26 and its corresponding contact receptacle 28. Likewise, the construction and height of the contact receptacle 28 facilitates reliable testing even in the present of height variations between test points on the UUT. In contrast, the use of double headed probes in conventional assemblies does not allow for differences in height between test points.

Although a preferred embodiment of the wireless test fixture has been specifically described and illustrated, it is to be understood that variations or alternative embodiments apparent to those skilled in the art are within the scope of this invention. Since many such variations may be made, it is to be understood that within the scope of the following claims, this invention may be practiced otherwise than specifically described.

What is claimed is:

1. A wireless assembly for communicating electrical signals between test equipment and a unit under test using probes having at a first end a spring-loaded head electrically connected to a test point on the unit under test, and having at a second end a fixed contact post, said wireless assembly comprising:

a translator board having at least one conductive pad electrically connected to the test equipment;

a guide plate attached to said translator board, said guide plate having a first through hole communicating with a bore;

a contact receptacle provided in said bore and electrically contacting said at least one conductive pad, said contact receptacle being adapted to at least partially receive the contact post, and having at least one contact finger configured to swipe the contact post and maintain electrical connection therebetween; and a spring provided in said bore and urging said contact receptacle into electrical contact with said at least one conductive pad;

wherein said contact receptacle is configured to allow travel of the contact post while maintaining electrical connection therebetween and without transmitting forces imparted to the probe to said translator board.

2. A wireless assembly for communicating electrical signals according to claim 1, wherein a generally planar surface of said guide plate contacts and is supported upon a generally planar surface of said translator board, said guide plate providing increased rigidity to said translator.

3. A wireless assembly for communicating electrical signals according to claim 1, further comprising:

at least one electrical component mounted on a surface of said translator board; and a surface of said guide plate defining a recess configured to receive said at least one electrical component.

4. A wireless assembly for communicating electrical signals according to claim 1, further comprising:

a probe plate maintained in a fixed spatial relationship from said guide plate by at least one standoff, said probe plate having a second through hole aligned with said first through hole, each of said first and second through holes being configured to receive the fixed contact post of the probe;

wherein the probe is provided with a compression ring having a slightly larger diameter than said second through hole such that said compression ring generally prevents movement of the probe within said second through hole when a force is applied in an axial direction of the probe.

5. A wireless assembly for communicating electrical signals according to claim 4, wherein a length of said contact receptacle along a longitudinal direction is longer than an insertion depth of said contact probe into said contact receptacle such that said contact probe is prevented from transmitting a downward force to said translator board even if flexure of said probe plate occurs.

6. A wireless assembly for communicating electrical signals according to claim 1, further comprising:
   at least one of a via provided on said translator board providing electrical interconnection between different conducting layers of said translator board and a conductive pad provided on said translator board;
   said contact receptacle being electrically connected to said at least one of a via;
   wherein a width of said contact post is generally independent of a width of said via.

7. A wireless assembly for communicating electrical signals between test equipment and a unit under test, comprising:
   a translator board electrically connected to the test equipment;
   a guide plate in abutment with said translator board, said guide plate having a bore communicating with a through hole;
   a probe plate in a spaced relationship with said guide plate board and having at least one through hole defined therethrough;
   a single-headed contact probe having a spring-loaded head at a first end, a fixed contact post at a second end; and
   a contact receptacle provided in said bore and electrically contacting said translator board, said contact receptacle being configured to at least partially receive said fixed contact post and provide electrical interconnection therebetween;
   wherein said fixed contact post is inserted through holes defined in said probe plate and said guide plate, and is at least partially received within said contact receptacle.

8. A wireless assembly for communicating electrical signals according to claim 7, further comprising:
   at least one standoff interposed between said guide plate and said probe plate;
   a compression ring defined on a circumference of said single-headed contact probe so as to generally prevent travel of said single-headed contact probe toward said translator board when a force is applied to said spring-loaded head in a direction toward said translator board.

9. A wireless assembly for communicating electrical signals according to claim 7, further comprising:
   at least one of a via provided on said translator board providing electrical interconnection between different conducting layers of said translator board and a conductive pad provided on said translator board;
   said contact receptacle being electrically connected to said at least one of a via;
   wherein a width of said contact post is generally independent of a width of said via.

10. A wireless assembly for communicating electrical signals according to claim 7, wherein a length of said contact receptacle along a longitudinal direction is longer than an insertion depth of the contact probe, such that the contact probe is prevented from transmitting forces to said translator board even if flexure of said probe plate occurs.

11. A wireless assembly for communicating electrical signals according to claim 7, further comprising:
    at least one electrical component mounted on a surface of said translator board; and
    a surface of said guide plate defining a recess configured to receive said at least one electrical component.

* * * * *